United States Patent [19]

Weng

[11] Patent Number: 4,858,467
[45] Date of Patent: Aug. 22, 1989

[54] GAUGER FOR CARS

[76] Inventor: Hsi K. Weng, NO. 35, Sec. 4, Lu Kang, Chang Huah, Taiwan

[21] Appl. No.: 225,919

[22] Filed: Jul. 29, 1988

[51] Int. Cl.$^4$ .......................... B60C 23/02; G01L 7/16
[52] U.S. Cl. ..................................... 73/146.8; 73/714; 73/744; 116/34 R; 116/272; 340/455
[58] Field of Search .................... 73/146.8, 744, 146.3, 73/714; 116/34 R, 272; 340/636, 52 R, 52 F, 455

[56] References Cited

U.S. PATENT DOCUMENTS

| 3,852,839 | 12/1974 | Blessing | 73/146.8 |
| 3,967,133 | 6/1976 | Bokern | 340/636 |
| 4,526,030 | 7/1985 | Vecera, Jr. | 73/146.8 |

Primary Examiner—Donald O. Woodiel
Attorney, Agent, or Firm—Fleit, Jacobson, Cohn, Price, Holman & Stern

[57] ABSTRACT

A gauger for a car includes a housing having a tubular receiving room, a gauge head having an air inlet and an axial projection capable of being urged against a car air valve, a pressure-measuring plunger slidably received in the receiving room, a piston engaging with the plunger for being forced by an air pressure to protrude plunger from the receiving room, an elastic member mounted for returning the piston to rest against the gauge head when the projection is removed from the air valve, two conducting members respectively mounted on the gauge head, and a circuit device electrically connected to the conductive members and capable of showing an electrical power state of a car battery. Such gauger is also designed to detect the wearing degree of a tire tread.

5 Claims, 5 Drawing Sheets

GAUGER FOR CARS

BACKGROUND OF THE INVENTION

The present invention relates to a gauger, and more particularly to a gauger for a car.

In order to ascertain whether a car is suitable for driving, one must make various detections, e.g. regarding the electric power of the battery, the tire pressure and the wearing degree of the tire tread all of which must be independently detected by 3 respective devices. Thus, it is inconvenient to store these devices at the same time. Furthermore, it is not cost-effective for the driver to equip himself with such devices. In addition, it is inconvenient to use all of these 3 devices each at a time. It is therefore tried by the Applicant to deal with these shortcomings encountered by the prior art.

SUMMARY OF THE INVENTION

It is therefore an object of the present invention to provide a gauger having multiple functions.

According to the present invention, a gauger for a car includes a housing having a tubular receiving room having a first opening and a second opening, a gauge head secured to the first opening and having an air inlet and an axial projection capable of being urged against a car air valve for guiding an air pressure from the air valve to pass into the inlet, a pressure-measuring plunger slidably received in the receiving room and having a first end and a second opposite end capable of protruding beyond the second opening, a piston engaging with the first end and capable of being forced by the air pressure to protrude the second end beyond the second opening, an elastic member mounted between the piston and the second opening and capable of returning the piston to rest against the gauge head when the projection is removed from the air valve, two conductive members respectively mounted on the gauge head, and a circuit device electrically connected to the conductive members and capable of showing an electric power state of a car battery when the conductive members are respectively electrically connected to two electrodes of the battery.

Preferably the second opening has a flat end surface and the second end is an indicator capable of showing a wearing degree of a tire tread of the car when the end surface is urged against the tire tread to leave the second end in a tread groove.

Preferably the conductive members are electrically connected to the battery by means of inserting the gauge head into a cigaret lighting hole in and of the car.

Certainly, the conductive members can be annular and the outer conductive member, the axial projection and the wall of the air inlet be integrally formed.

The present invention may best be understood through the following description with reference to the accompanying drawings, in which:

DETAILED DESCRIPTION OF THE PREFERRED EMBODIMENT

Figure 1:
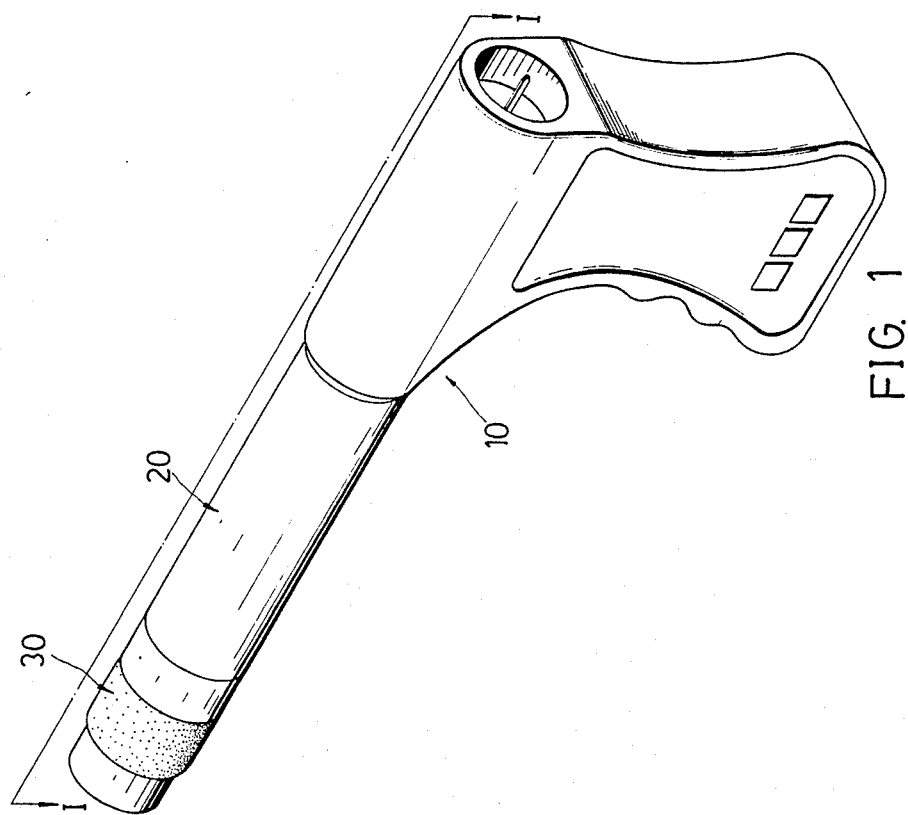
FIG. 1 is a perspective view showing a preferred embodiment of a gauger for a car according to the present invention.
Figure 2:
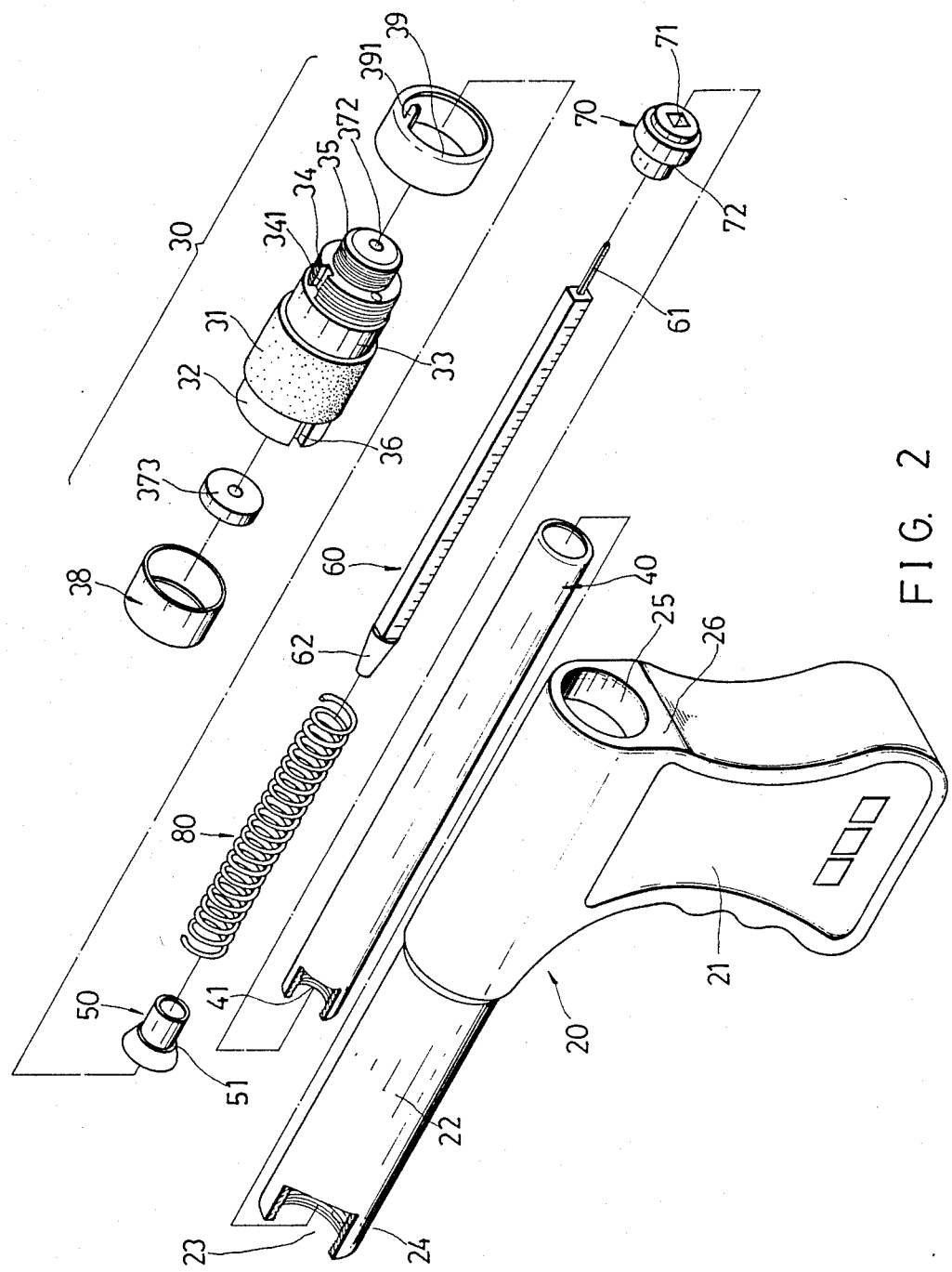
FIG. 2 is an exploded view of a gauger for a car in FIG. 1.
Figure 3:
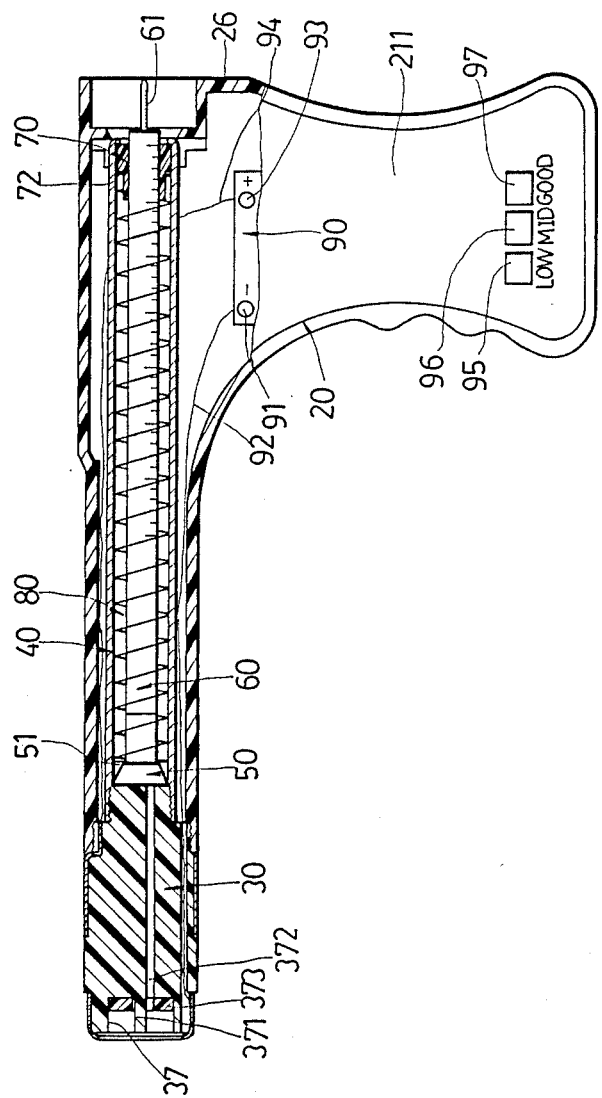
FIG. 3 is a sectional view taken along line I—I in FIG. 1.

Referring now to FIGS. 1-3, a gauger 10 for a car according to the present invention includes a pistol-shaped housing 20, a gauger head 30, a tubular sleeve 40, a piston 50, a plunger 60, a guiding piece 70, an elastic member 80, and a circuit device 90. Housing 20 has a hand grip 21 above which a hollow tube 22 having a tubular receiving room having a first opening 23 and a second opening 25 horizontally extends. Opening 23 has a female thread 24 and opening 25 has a flat end surface 26.

Gauge head 30 is cylindrical and includes a first portion 31, a second stepped portion 32, a third stepped portion 33, a fourth stepped threaded portion 34 having a groove 341 and matching with female thread 24, a fifth stepped threaded portion 35 screwing thereto a threaded end 41 of sleeve 40, an eccentric axial through hole 36, a front recess 37 which has a central axial projection 371, communicates with an air inlet 372 so that when projection 371 is urged against a car air valve, it will guide an air pressure from the air valve to pass into inlet 372, and receives therein a washer 373, a first conductive member 38 mounted on second portion 32, and a second conductive member 39 mounted on third portion 33 and having an axial extension 391 for being bent to be retained in groove 341. Members 38 and 39 are annular and certainly, conductive member 38, axial projection 371 and the wall of inlet 372 can be integrally formed if desired.

Plunger 60 slidably received in sleeve 40 has a head 62 and an indicating tail 61 and is graduated. Piston 50 engaging with head 62 is capable of being forced by the air pressure from inlet 372 to protrude tail 61 beyond opening 25, and has a shoulder surface 51. Guiding piece 70 fixed to the end of sleeve 40 opposite to end 41 has a through hole 71 capable of guiding and protruding therethrough the tail end of plunger 60 and a shoulder surface 72. Spiral spring 80 is mounted between shoulder surfaces 51 and 72 and will return piston 50 to rest against gauge head 30 when projection 371 is removed from the air valve.

Circuit device 90 received in hand grip 21 and electrically connected to conductive members 38 and 19 at terminals 91 and 93 by electrical wires 92 and 94 includes a low power indicator lamp 95 an intermediate power lamp 96 and a normal power lamp 97 all of which are mounted on the same surface 211 of hand grip 21. Since the operation of circuit device 90 is well-known in the relevant art, no further details in this respect will be given.

When the present gauger 10 is to measure the tire pressure, projection 371 is urged against the air valve in order to protrude plunger 60 beyond through hole 71 and opening 25 to read therefrom the air pressure shown thereon.

Figure 4:
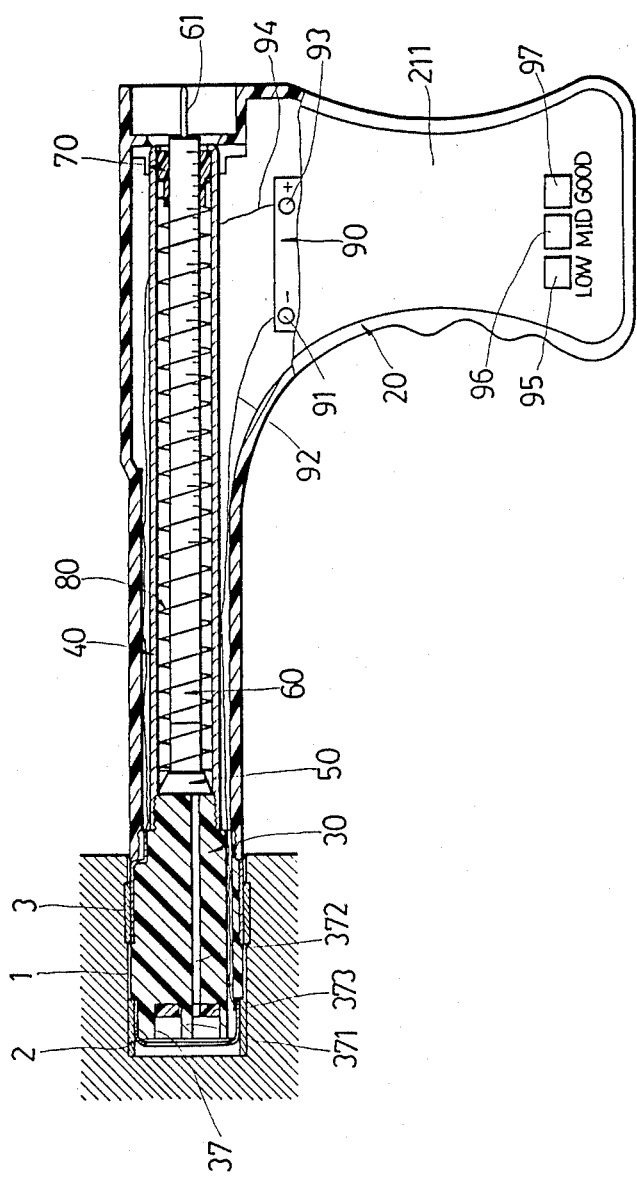
FIG. 4 is a schematic view showing a gauger in FIG. 1 in measuring the electric power of a car battery.

As shown in FIG. 4, when the present gauger 10 is to measure the power state of the car battery, gauge head 30 is inserted into a cigaret lighting hole 1 (in and of the car) disposing therein two live source terminals 2 and 3 respectively connecting with conductive members 38 and 39 for selectively energizing one of lamps 95, 96 and 97.

Figure 5:
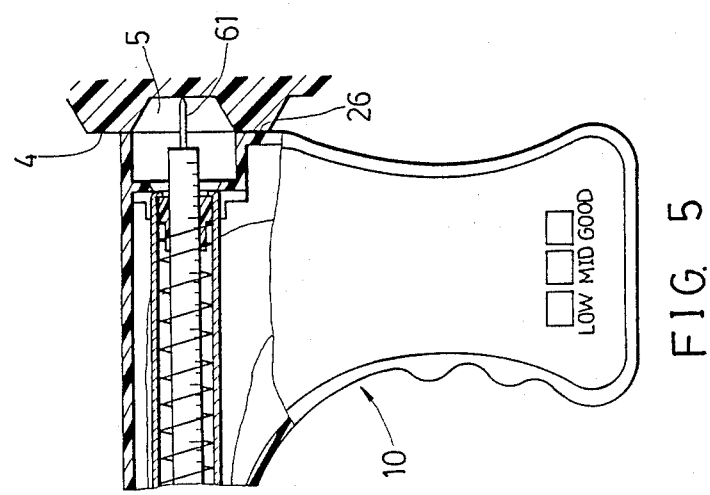
FIG. 5 is a schematic view showing a gauger for a car in FIG. 1 in measuring the depth of a tread groove of a tire.

As shown in FIG. 5, when the present gauger 10 is to detect the wearing degree of a tire tread 4, tail 61 is first pulled out from opening 25. When flat end surface 26 is urged against the tire tread 4 to leave tail 61 in a tread groove 5, the scale on tail 61 will show what the depth of tread groove 5 is.

Through the above description, it should now become readily apparent how and why the present gauger 10 can achieve the object it contemplates.

What I claim is:

1. A gauger for a car comprising:
   a housing having a tubular receiving room having a first opening and a second opposite opening;
   a gauge head secured to said first opening and having an air inlet and an axial projection capable of being urged against an air valve of said car for guiding an air pressure from said air valve to pass into said inlet;
   a pressure-measuring plunger slidably received in said receiving room and having a first end and a second opposite end capable of protruding beyond said second opening;
   a piston engaging with said first end and capable of being forced by said air pressure to protrude said second end beyond said second opening;
   an elastic member mounted between said piston and said second opening and capable of returning said piston to rest against said gauge head when said projection is removed from said air valve;
   two conductive members respectively mounted on said gauge head; and
   a circuit device electrically connected to said conductive members and capable of showing an electric power state of a battery of said car when said conductive members are respectively electrically connected to two electrodes of said battery.

2. A gauger for a car as claimed in claim 1 wherein:
   said second opening has a flat end surface; and
   said second end is an indicator capable of showing a wearing degree of a tire tread of said car when said end surface is urged against said tire tread to leave said second end in a tread groove.

3. A gauger for a car according to claim 1 wherein said conductive members are electrically connected to said battery by means of inserting said gauge head into a cigarette lighting hole in and of said car.

4. A gauger for a car according to claim 3 wherein one of said conductive members, said axial projection and a wall of said air inlet are integrally formed.

5. A gauger for a car according to claim 3 wherein said conductive members are annular, and said housing is pistol-shaped.

* * * * *